United States Patent [19]

Koishikawa

[11] Patent Number: 5,763,927
[45] Date of Patent: Jun. 9, 1998

[54] HIGH-VOLTAGE LATERAL FIELD EFFECT TRANSISTOR HAVING AUXILIARY DRAIN ELECTRODE FOR A STEP-DOWN DRAIN VOLTAGE

[75] Inventor: Yukimasa Koishikawa, Tokyo, Japan

[73] Assignee: NEC Corporation, Japan

[21] Appl. No.: 802,312

[22] Filed: Feb. 18, 1997

[30] Foreign Application Priority Data

Feb. 28, 1996 [JP] Japan ............... 8-041396

[51] Int. Cl.$^6$ ............................... H01L 29/80
[52] U.S. Cl. ............... 257/408; 257/344; 257/343; 257/491
[58] Field of Search ............... 257/408, 344, 257/335, 343, 491, 492, 487

[56] References Cited

U.S. PATENT DOCUMENTS

| | | | |
|---|---|---|---|
| 4,811,075 | 3/1989 | Eklund | 257/408 |
| 5,072,268 | 12/1991 | Rumennik | 257/339 |
| 5,258,636 | 11/1993 | Rumennik et al. | 257/339 |
| 5,264,719 | 11/1993 | Beasom | 257/335 |
| 5,294,824 | 3/1994 | Okada | 257/409 |
| 5,313,082 | 5/1994 | Eklund | 257/262 |
| 5,559,346 | 9/1996 | Kushida | 257/138 |

*Primary Examiner*—Tom Thomas
*Assistant Examiner*—David B. Hardy
*Attorney, Agent, or Firm*—Hayes, Soloway, Hennessey, Grossman & Hage, P.C.

[57] ABSTRACT

A high-voltage lateral field effect transistor has a lightly doped n-type extended drain region depleted by depletion layers extending from a p-n junction between the lightly doped n-type extended drain region and a p-type silicon substrate and a p-n junction between the lightly doped extended drain region and a p-type impurity region formed in a surface portion thereof, and an n-type step-down region contiguous with the lightly doped n-type extended drain region is formed in a surface of the p-type impurity region so as to permit a step-down drain voltage lower than the drain voltage to be transmitted therefrom, thereby preventing damage to a gate insulating layer of a field effect transistor.

8 Claims, 5 Drawing Sheets

5,763,927

HIGH-VOLTAGE LATERAL FIELD EFFECT TRANSISTOR HAVING AUXILIARY DRAIN ELECTRODE FOR A STEP-DOWN DRAIN VOLTAGE

FIELD OF THE INVENTION

This invention relates to a high-voltage lateral field effect transistor and, more particularly, to a high-voltage lateral field effect transistor for withstanding high voltage without deterioration of transistor characteristics.

DESCRIPTION OF THE RELATED ART

A field effect transistor is an important circuit component, and various electric circuits are implemented by field effect transistors. The bias condition of these field effect transistors is not identical from one electric circuit to another, and some field effect transistors are expected to work under large bias voltage. A lateral field effect transistor withstands a large bias voltage, and is appropriate for use in a circuit component for working under a large bias condition. However, recent user expectations include that the lateral field effect transistor operate at high speed and with small power-consumption.

A typical example of a high-voltage lateral field effect transistor is disclosed in U.S. Pat. No. 4,811,075, and FIG. 1 illustrates a high-voltage lateral field effect transistor disclosed in this U.S. Patent.

The prior art lateral field effect transistor is fabricated on a lightly doped p-type semiconductor substrate 1, and comprises a gate oxide layer 2a, a gate electrode 2b and an inter-level insulating oxide layer 2c. The gate oxide layer 2a covers a part of the major surface of the lightly doped p-type semiconductor substrate 1, and the gate electrode 2b is formed on the gate oxide layer 2a. The thickness of the gate oxide layer 2a is dependent on a potential difference between the gate electrode 2b and a source region. The gate electrode 2c and the exposed major surface of the lightly doped p-type semiconductor substrate 1 are covered with the inter-level oxide layer 2c, and contact holes 2d/2e are formed in the inter-level oxide layer 2c. The contact hole 2e is spaced from the gate electrode 2b rather than the other contact hole 2d.

The prior art lateral field effect transistor further comprises a lightly doped n-type extended drain region 2f, a p-type top layer 2g, a heavily doped n-type pocket 2h and a p-type channel region 2i. The p-type channel region 2i is beneath the gate oxide layer 2a, and is subjected to a punch-through implant and a threshold voltage implant. The lightly doped n-type extended drain region 2f is elongated from the contact hole 2e to the p-type channel region 2i, and the leading end portion of the lightly doped n-type extended drain region 2f is beneath the gate oxide layer 2a. The p-type top layer 2g is nested into the lightly doped n-type extended drain region 2f, and is also elongated from the contact hole 2e to the heading end portion of the lightly doped n-type extended drain region 2f under the edge of the gate electrode 2b. The heavily doped n-type pocket 2h is contiguous to with the p-type channel region 2i, and opposes to the leading end of the lightly doped n-type extended drain region 2f.

The prior art lateral field effect transistor further comprises a heavily doped p-type pocket 2j serving as a back gate region, a heavily doped n-type pocket 2k, a source metal contact 2m and a drain metal contact 2n. The heavily doped p-type pocket is contiguous with the heavily doped n-type pocket 2h, and the source metal contact 2m is held in contact through the contact hole 2d with both of the heavily doped n-type pocket 2h and the heavily doped p-type pocket 2j. On the other hand, the heavily doped n-type pocket 2k penetrates through the p-type top layer 2g into the lightly doped n-type extended drain region 2f, and the drain metal contact 2n is held in contact through the contact hole 2e with the heavily doped n-type pocket 2k.

The heavily doped n-type pocket 2h serves as a source region, and current flows between the lightly doped n-type extended drain region 2f and the heavily doped n-type pocket 2h. When the prior art high-voltage lateral field effect transistor turns off, large reverse bias is applied between the heavily doped n-type pocket 2h and the lightly doped n-type extended drain region 2f, and the lightly doped n-type extended drain region 2f is depleted. The depletion layer consumes most of the large reverse bias, and the prior art high-voltage lateral field effect transistor is prevented from break-down.

When the drain electrode 2n of the prior art high-voltage field effect transistor is connected to the gate electrode 2b thereof, a large potential difference is expected between the gate electrode 2a and the source region 2h, and the manufacturer increases the thickness of the gate oxide layer so as to cause the prior art high-voltage field effect transistor to withstand the large gate potential. For example, if the gate potential is enlarged to 100 volts, the gate oxide layer 2a is increased to 300 nanometers to 500 nanometers in thickness. However, the thick gate oxide layer 2a increases the threshold of the prior art high-voltage field effect transistor, or decreases the mutual conductance. Moreover, the thick gate oxide layer 2a deteriorates high-frequency transistor characteristics, and power consumption is increased. Thus, the large gate potential is not desirable, and is the first problem inherent in the prior art high-voltage field effect transistor.

Another problem is a high-voltage output signal produced by the prior art high-voltage field effect transistor. An output signal is usually taken out from the drain node of a field effect transistor. If the prior art high-voltage field effect transistor forms a part of an electric circuit, the output signal swings the potential level between the high drain voltage and the low source voltage. The output signal is propagated to the gate electrode of a standard field effect transistor, and a thick gate oxide layer is required for the standard field effect transistor.

SUMMARY OF THE INVENTION

It is therefore an important object of the present invention to provide a high-voltage lateral field effect transistor which is free from the problems inherent in the prior art high-voltage field effect transistor.

To accomplish this object, the present invention proposes to internally step down a drain voltage of a high-voltage lateral field effect transistor.

In accordance with the present invention, there is provided a lateral field effect transistor fabricated on a semiconductor layer of a first conductivity type, comprising: a channel region formed in a first surface portion of the semiconductor layer; a gate insulating layer formed on the channel region; a gate electrode formed on the gate insulating layer; a source region formed in a second surface portion of the semiconductor layer on one side of the first surface portion, and having a second conductivity type opposite to the first conductivity type; a lightly doped impurity region of the second conductivity type formed in a third surface portion of the semiconductor layer on the other side of the first surface portion; a heavily doped drain region of the second conductivity type formed in a first surface portion of the lightly doped impurity region; a biased region of the first conductivity type formed in a second surface portion of the lightly doped impurity region between the channel region and the heavily doped drain region; a step down region of the second conductivity type formed between portions of the biased region, and connected to the lightly doped impurity region; a source electrode connected to the heavily doped source region; a main drain electrode connected to the heavily doped drain region, and reversely biasing the lightly doped impurity region with respect to the biased region and the semiconductor layer so as to deplete the lightly doped impurity region between the biased region and the semiconductor layer; and an auxiliary drain electrode connected to the lightly doped impurity region for transmitting a step-down potential level therefrom.

BRIEF DESCRIPTION OF THE DRAWINGS

The features and advantages of the high-voltage lateral field effect transistor according to the present invention will be more clearly understood from the following description taken in conjunction with the accompanying drawings in which.

DETAILED DESCRIPTION OF THE PREFERRED EMBODIMENTS

First Embodiment

Figure 1:
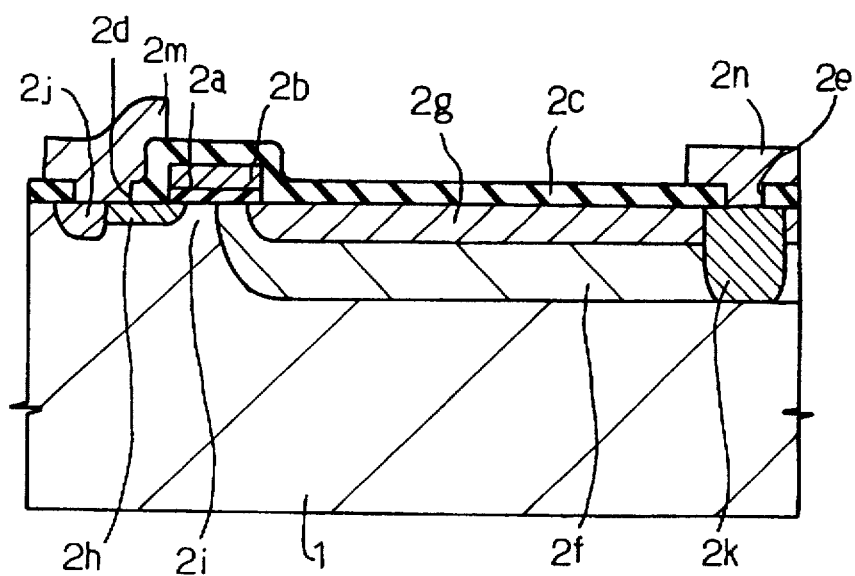
FIG. 1 is a cross sectional view showing the structure of the prior art high-voltage lateral field effect transistor.
Figure 2:
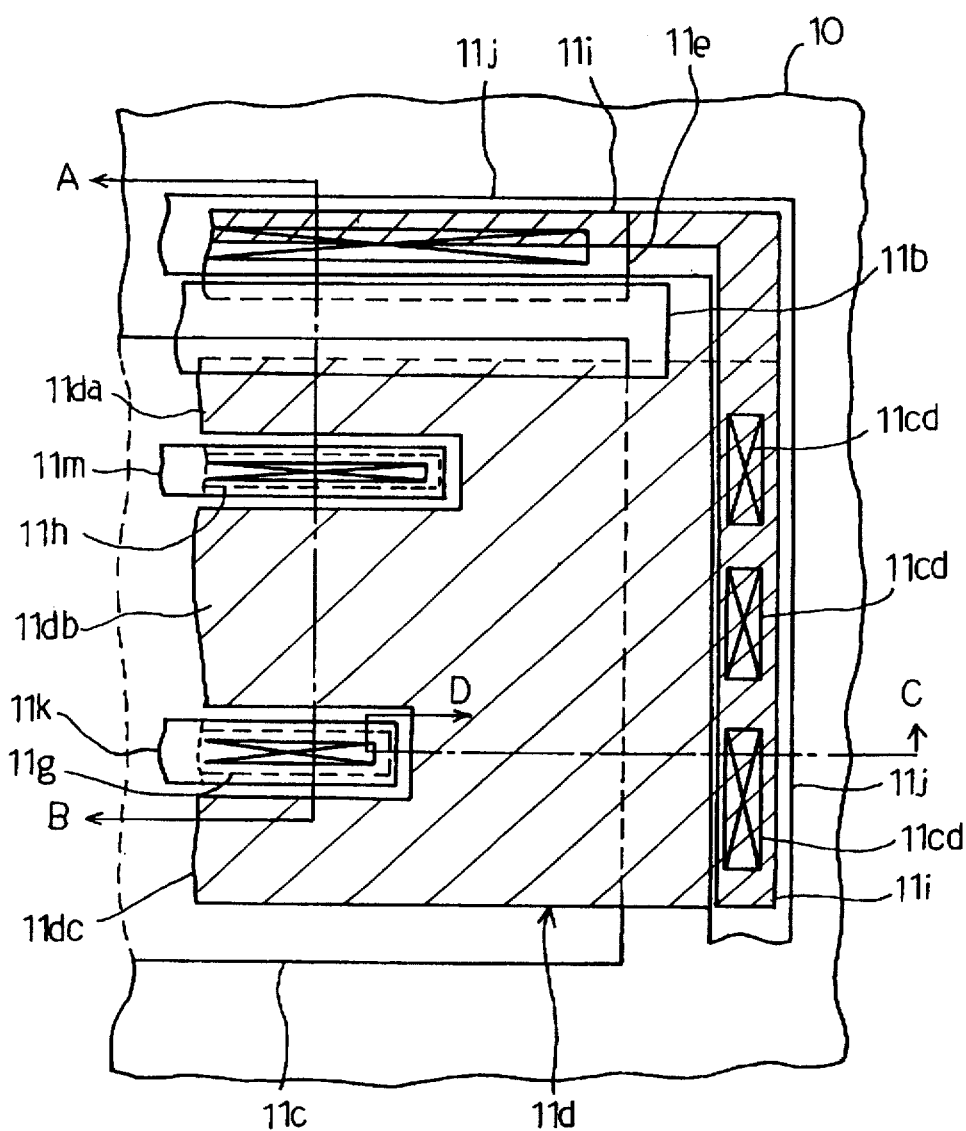
FIG. 2 is a plan view showing the layout of a high-voltage lateral field effect transistor according to the present invention.
Figure 3:
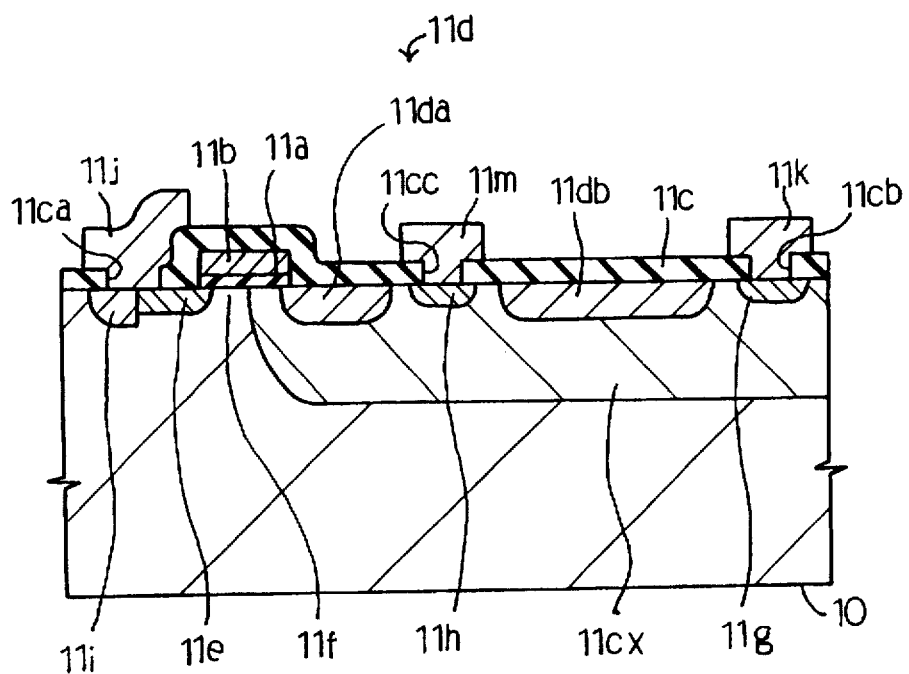
FIG. 3 is a cross sectional view taken along line A–B of FIG. 2 and showing the structure of the high-voltage lateral field effect transistor.
Figure 4:
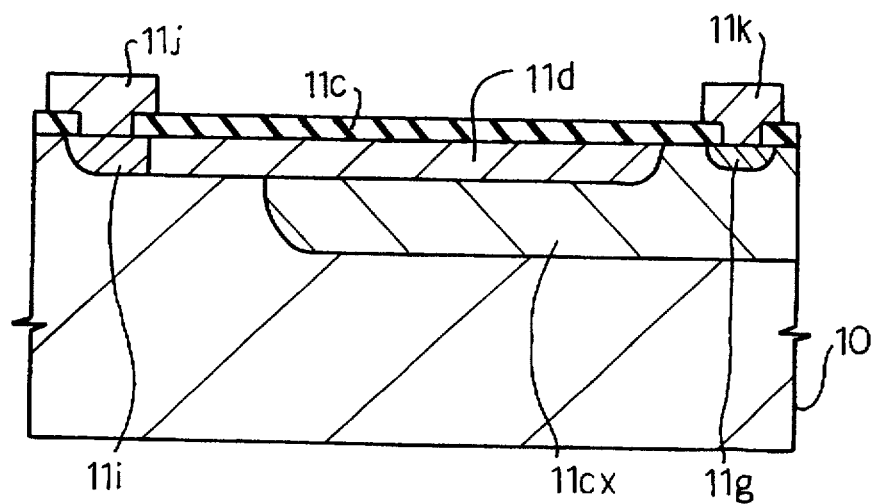
FIG. 4 is a cross sectional view taken along line C–D of FIG. 2 and showing the structure of the high-voltage lateral field effect transistor.

Referring to FIGS. 2 to 4 of the drawings, a high-voltage lateral field effect transistor embodying the present invention is fabricated on a p-type silicon substrate 10. The p-type silicon substrate 10 is usually grounded. The high-voltage lateral field effect transistor comprises a gate insulating layer 11a covering a part of the major surface of the p-type silicon substrate 10, a gate electrode 11b formed on the gate insulating layer 11a and an inter-level insulating layer 11c covering the gate electrode 11b and the remaining major surface of the p-type silicon substrate 10. In FIG. 2, the inter-level insulating layer 11c is omitted so as to clearly show the layout of impurity regions and electrodes, and p-type regions are hatched so as to clearly discriminate n-type regions. Although the inter-level insulating layer 11c is not shown in FIG. 2, the locations of contact holes formed therein are indicated by mark "X", and the mark allows us to confirm the connections between impurity regions and electrodes.

The high-voltage lateral field effect transistor further comprises a lightly doped n-type extended drain region 11cx, a p-type impurity region 11d, a heavily doped n-type source region 11e and a p-type channel region 11f. The lightly doped n-type extended drain region 11cx is formed in a surface portion of the p-type silicon substrate 10, and is partially overlapped with the gate insulating layer 11a. The heavily doped n-type source region 11e is also partially overlapped with the gate insulating layer 11a, and is opposed to the lightly doped n-type extended drain region 11cx. The p-type channel region 11f is provided between the lightly doped n-type extended drain region 11cx and the heavily doped n-type source region 11e under the gate insulating layer 11f.

The p-type impurity region 11d has a comb-like configuration, and has finger portions 11da, 11da and 11dc. The lightly doped n-type extended drain region 11cx is partially overlapped with the p-type impurity region 11d, and is exposed to gaps between the finger portions 11da, 11db and 11dc.

The high-voltage lateral field effect transistor further comprises a heavily doped n-type drain region 11g and a heavily doped n-type step-down region 11h. The heavily doped n-type drain region 11g is formed in the lightly doped n-type extended drain region 11cx exposed to the gap between the finger portions 11db and 11dc, and is spaced from the p-type impurity region 11d. The heavily doped n-type step-down region 11h is also formed in the lightly doped n-type extended drain region 11cx exposed to the gap between the finger portions 11da and 11db. A drain potential is spread from the heavily doped n-type drain region 11g over the lightly doped n-type extended drain region 11c, and the drain potential is reduced at the heavily doped n-type step-down region 11h.

The high-voltage lateral field effect transistor further comprises a heavily doped p-type back gate region 11i contiguous with the heavily doped n-type source region 11e. The heavily doped p-type back gate region 11i is bent at 90 degrees (see FIG. 2), and is further contiguous to the p-type impurity region 11d (see FIG. 4). Thus, the heavily doped p-type back gate region 11i forms the boundary partially with the heavily doped n-type source region 11e and partially with the p-type impurity region 11d.

The high-voltage lateral field effect transistor further comprises a source electrode 11j, a main drain electrode 11k and an auxiliary drain electrode 11m. Contact holes 11ca, 11cb, 11cc and 11cd are formed in the inter-level insulating layer 11c, and the locations of the contact holes 11ca to 11cc are indicated by the mark X in FIG. 2. The heavily doped n-type source electrode 11j extends along the p-type back gate region 11i, and is, accordingly, bent at 90 degrees. The contact hole 11ca is located over the boundary between the heavily doped n-type source region 11e and the heavily doped n-type back gate region 11i, and the contact holes 11cd are provided over the heavily doped p-type back gate region 11i. For this reason, the source electrode 11i is held in contact through the contact hole 11ca with both of the heavily doped n-type source region 11e and the heavily doped p-type back gate region 11i and through the contact holes 11cd with the heavily doped p-type back gate region 11i. The heavily doped n-type drain region 11g and the heavily doped n-type step-down region 11h 11m are exposed to the contact hole 11cb and the other contact hole 11cc, respectively, and the main drain electrode 11k and the auxiliary drain electrode 11m are held in contact through the contact hole 11cb and the other contact hole 11cc with the heavily doped n-type drain region 11g and the heavily doped n-type step-down region 11h, respectively.

The source electrode 11j is electrically connected to not only the heavily doped n-type source region 11e but also the p-type impurity region 11d through the heavily doped p-type back gate region 11i. The ground potential is usually supplied to the source electrode 11j, and the heavily doped n-type source region 11e is equalized with the p-type impurity region 11d. On the other hand, the main drain electrode 11k is electrically connected to a positive power voltage source (not shown), and a high power voltage is supplied to the heavily doped n-type drain region 11g.

The high voltage lateral field effect transistor is fabricated through the following process. The process starts with preparation of p-type silicon substrate 10, and the p-type silicon substrate has resistivity on the order of 40 ohm-cm. N-type dopant impurity is introduced into a surface portion of the p-type silicon substrate 10 so as to form the lightly doped n-type extended drain region 11cx. The lightly doped n-type extended drain region 11cx has dopant concentration on the order of $1\times10^{16}$ cm$^{-3}$, and form the p-n junction at 7.5 microns in depth.

Subsequently, p-type dopant impurity is selectively introduced in such a manner as to partially overlap the p-type impurity region 11d with a part of the lightly doped n-type extended drain region 11cx. The p-type impurity region 11d has p-type dopant concentration of $1\times10^{17}$ cm$^3$ and depth on the order of 0.5 micron.

The gate insulating layer 11a is thermally grown to a thickness of 50 nanometers, and the gate electrode 11b is formed from a phosphorous-doped polysilicon layer. The gate electrode 11b may have a polyside structure using a refractory metal such as tungsten.

Subsequently, arsenic is selectively ion implanted into the p-type silicon substrate 10 and the lightly doped n-type extended drain region 11cx, and forms the heavily doped n-type drain region 11g, the heavily doped n-type step-down region 11h and the heavily doped n-type source region through a heat treatment. Boron is also selectively ion implanted into the p-type silicon substrate 10, and forms the heavily doped p-type back gate region 11i through a heat treatment.

Silicon oxide is deposited over the entire surface of the resultant structure, and forms the inter-level insulating layer 11c. The contact holes 11ca to 11cd are formed in the inter-level insulating layer 11c through lithographic techniques, and a conductive layer deposited over the inter-level insulating layer 11c is patterned into source electrode 11j, main drain electrode 11k and auxiliary drain electrode 11m.

In this instance, the lightly doped extended drain region 11cx and the p-type impurity region 11i respectively serve as a lightly doped impurity region and a biased region, and a semiconductor layer is implemented by the p-type silicon substrate.

Assuming now that the drain electrode 11k is biased to 100 volts, depletion layers extend from the p-n junction between the p-type silicon substrate 10 and the lightly doped n-type extended drain region 11cx and the p-n junction between the p-type impurity region 11d and the lightly doped n-type extended drain region 11cx, and the lightly doped n-type extended drain region 11cx and the p-type impurity region 11d are completely depleted. Pinch-off takes place around the boundary between the lightly doped n-type extended drain region 11cx and the channel region 11f. As a result, the drain potential decreases from the heavily doped n-type drain region 11g toward the channel region 11f.

Figure 5:
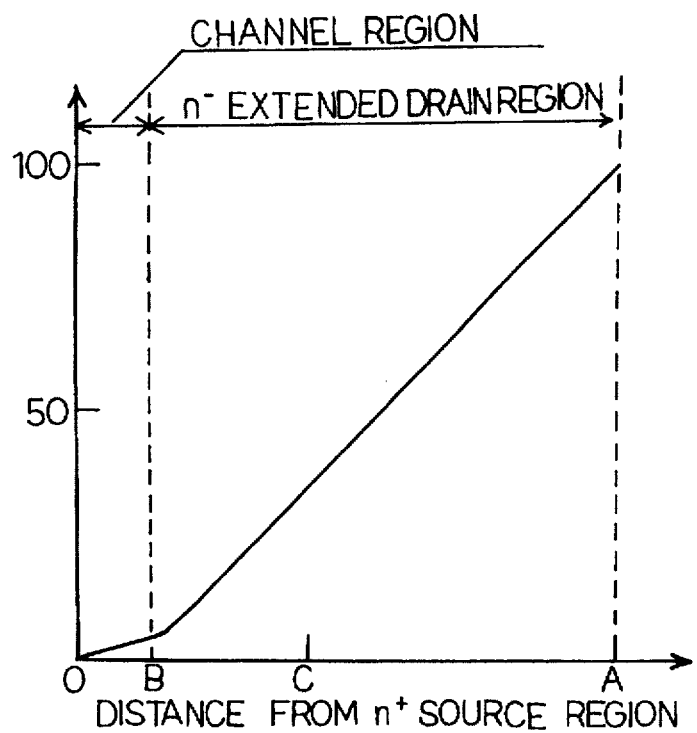
FIG. 5 is a graph showing the potential level varied together with the distance from a heavily doped p-type drain region of the high-voltage lateral field effect transistor according to the present invention.

FIG. 5 illustrates the potential level in the lightly doped n-type extended drain region 11cx and the channel region 11f. The potential level is linearly decreased from the boundary between the heavily doped n-type drain region 11g and the lightly doped n-type extended drain region 11cx at point A toward the boundary between the lightly doped n-type extended drain region 11cx and the channel region 11f at point B, and the potential level is further decreased toward the heavily doped n-type source region 11e. Therefore, the potential level at the heavily doped step-down region 11h at point C is inversely proportional to the distance between the heavily doped n-type drain region 11g and the heavily doped n-type step-down region 11h. If the heavily doped n-type step-down region 11h is at the mid-point between the heavily doped n-type drain region 11g and the heavily doped n-type step-down region 11h, the potential level at the auxiliary drain electrode 11m is about 50 volts. Of course, the manufacturer can change the potential level at the auxiliary drain electrode by selecting the location of the heavily doped n-type step-down region 11h.

When an output signal is taken out from the auxiliary drain electrode 11m, the output signal potential level swings within a narrow range, and the manufacturer makes the gate insulating layer of a standard field effect transistor applied with the output signal thinner than that of the prior art circuit. Thus, the high-voltage lateral field effect transistor according to the present invention produces output signal potential level swing within a narrow range, and does not deteriorate transistor characteristics of the field effect transistor at the next stage.

Second Embodiment

Figure 6:
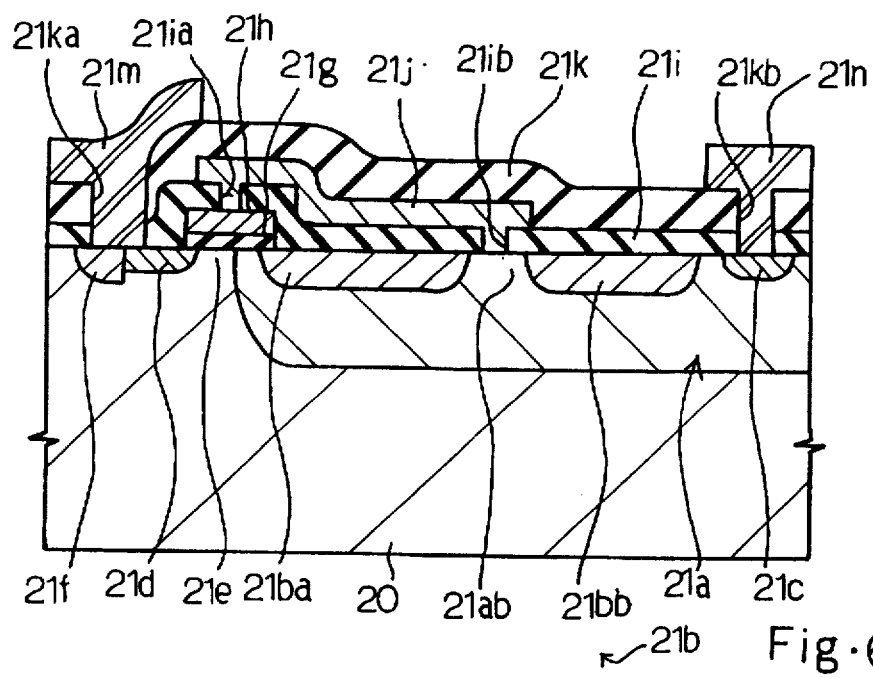
FIG. 6 is a cross sectional view showing the structure of another high-voltage lateral field effect transistor according to the present invention.

Turning to FIG. 6 of the drawings, another high-voltage lateral field effect transistor embodying the present invention is fabricated on a p-type silicon substrate 20. FIG. 6 shows a cross section of the high-voltage lateral field effect transistor corresponding to the cross section shown in FIG. 3.

The p-type silicon substrate 20 has resistivity on the order of 10 ohm-cm. A lightly doped n-type extended drain region 21a is formed in a surface portion of the p-type silicon substrate 20, and is doped at $5\times10^{16}$ cm$^{-3}$. The lightly doped n-type extended drain region 21a forms a p-n junction together with the p-type silicon substrate 20 around 2 micron in depth.

A p-type impurity region 21b is formed in a surface portion of the lightly doped n-type impurity region 21a, and is doped at $1\times10^{17}$ cm$^{-3}$. The p-type impurity region 21b has a comb-like configuration, and forms a p-n junction around 0.2 micron in depth. A gap takes place between finger portions 21ba and 21bb of the p-type impurity region 21b, and a surface portion 21ab of the lightly doped n-type extended drain region 21a is exposed to the gap.

A heavily doped n-type drain region 21c is formed in another surface portion of the lightly doped n-type extended drain region 21a, and is spaced from the p-type impurity region 21b. A heavily doped n-type source region 21d is formed in another surface portion of the p-type silicon substrate 20, and opposes through a channel region 21e the lightly doped n-type extended drain region 21a.

A heavily doped p-type back gate region 21f is formed in yet another surface portion of the silicon substrate 20, and is contiguous with the heavily doped n-type source region 21d and the p-type impurity region 21b in a similar fashion as in the first embodiment.

A gate insulating layer 21g is thermally grown to 100 nanometers in thickness, and the channel region 21e, a part of the heavily doped n-type source region 21d and a part of the lightly doped n-type extended drain region 21a are covered with the gate insulating layer 21g. A gate electrode 21h is formed on the gate insulating layer 21g, and is formed of phosphorous-doped polysilicon.

The gate electrode 21h, the impurity regions 21f/21d/21a/21b and the channel region 21e are covered with a first inter-level insulating layer 21i, and contact holes 21ia and 21ib are formed in the first inter-level insulating layer 21i. The gate electrode 21h and the lightly doped n-type extended drain region 21a between the finger portions 21ba/21bb are exposed to the contact holes 21ja and 21jb, respectively. A conductive strip 21j is formed on the first inter-level insulating layer 21i, and is held in contact through the contact holes 21ia/21ib with the gate electrode 21h and the lightly doped n-type extended drain region 21a. The conductive strip 21j is a multi-layer structure of a titanium nitride film and a arsenic-doped polysilicon film, and the dopant concentration of the arsenic-doped polysilicon film is roughly equal to that of the lightly doped n-type extended drain region 21a. In this instance, the dopant concentration of the arsenic-doped polysilicon film is on the order of $5 \times 10^{16}$ cm$^{-3}$.

The conductive strip 21j is formed as follows. Firstly, the contact holes 21ia/21ib are formed through lithographic techniques, and polysilicon is deposited to 200 nanometers in thickness by using a chemical vapor deposition. Arsenic is ion implanted into the polysilicon film at dose of $1 \times 10^{12}$ cm$^{-2}$ under acceleration energy of 50 KeV. Titanium nitride is deposited to 50 nanometers thick over the arsenic-doped polysilicon film, and the arsenic-doped polysilicon film is overlain by the titanium nitride film. The lamination is subjected to a heat treatment, and is patterned into the conductive strip 21j. The conductive strip 21j may be formed of doped polysilicon.

The conductive strip 21j and the first inter-level insulating layer 21i are covered with a second inter-level insulating layer 21k, and contact holes 21ka/21kb are formed in the first and second inter-level insulating layers 21i/21k. The heavily-doped p-type back gate region 21f and the heavily doped n-type source region 21d are exposed to the contact hole 21ka, and the heavily doped n-type drain region 21c is exposed to the contact hole 21kb.

A source electrode 21m is held in contact with the heavily-doped p-type back gate region 21f and the heavily-doped n-type source region 21d, and a main drain electrode 21m is held in contact with the heavily doped drain region 21c. Although the heavily doped p-type back gate region 21f is further exposed to other contact holes further formed in the first and second inter-level insulating layers 21i/21k, the other contact holes are not seen in FIG. 6.

In this instance, the p-type impurity region 21b and the surface portion 21ab of the lightly doped n-type extended drain region 21a serve as a biased region and a lightly doped impurity region, and an auxiliary drain electrode is implemented by the conductive strip 21j.

The drain potential is gradually reduced from the heavily doped n-type drain region 21c toward the boundary between the channel region 21e and the lightly doped n-type extended drain region 21a due to the depletion layer, and a step-down voltage is taken out from the surface portion 21ab. The step-down voltage level is changed together with the location of the surface portion 21ab in a similar fashion as in the first embodiment.

Moreover, the heavily doped step-down region is deleted from the surface of the lightly doped n-type extended drain region 21a, and, for this reason, the finger portions 21ba and 21bb are closer to each other rather than the finger portions 11da and 11db. The finger portions 21ba and 21bb enhance the potential reduction, and, accordingly, increases ability to withstand voltage.

Application of High-voltage Lateral Field Effect Transistor

Figure 7:
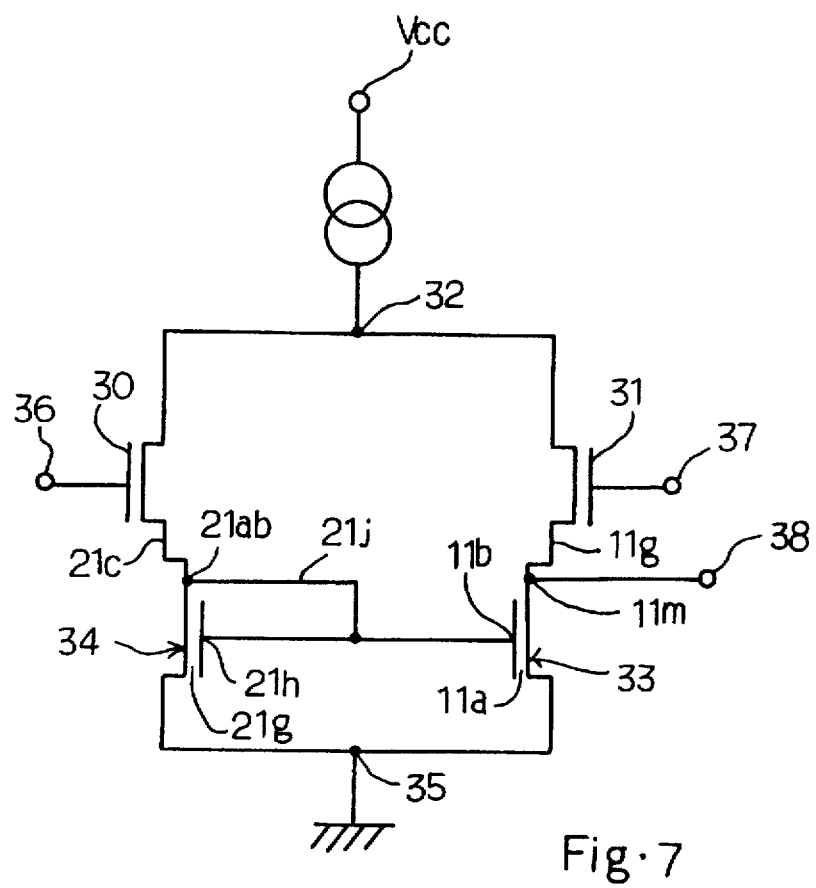
FIG. 7 is a circuit diagram showing the arrangement of a differential amplifier in which the high-voltage lateral field effect transistors are incorporated.

The high-voltage lateral field effect transistors are available for a differential amplifier as shown in FIG. 7. The differential amplifier may be fabricated on a single semiconductor substrate.

The differential amplifier includes two prior art high-voltage lateral field effect transistors 30/31 connected in parallel to a common node 32, and a positive power voltage Vcc is electrically connected to the common node 32. The differential amplifier further includes a high-voltage lateral field effect transistor shown in FIGS. 2 to 4 and a high-voltage lateral field effect transistor shown in FIG. 6 connected in parallel between the prior art high-voltage lateral field effect transistors 30/31 and another common node 35, and the common node 35 is grounded.

The gate electrodes of the prior art high-voltage lateral field effect transistors 30/31 are connected to signal input nodes 36 and 37, and an input potential difference is applied between the signal input nodes 36 and 37. The gate electrodes 11b, 21h of the high-voltage lateral field effect transistors 33, 34 are electrically connected to each other, and the conductive strip 21j propagates the drain potential to the gate electrodes 21h and 11b. The auxiliary drain node 11m is connected to an output node 38, and an output signal is supplied from the auxiliary drain node 11m through the output node 38 to another field effect transistor (not shown).

Assuming now that the potential level at the signal input node 36 raises from a low level to a high level, the prior art high-voltage lateral field effect transistor 30 turns on, and the positive power voltage increases the potential level at the heavily doped n-type drain region 21c. However, the drain potential level is reduced during propagation through the lightly doped n-type extended drain region 21a, and a step-down voltage is applied through the conductive strip 21j to the gate electrodes 21h and 11b. For this reason, the gate insulating layers 11a/21g are never damaged. This means that the manufacturer can decrease the thickness of the gate insulating layers 11a/21g, and the thin gate insulating layers 11a/21g decrease the threshold of the high-voltage lateral field effect transistors 33/34 or increase the mutual conductance thereof. The thin gate insulating layers 11a/21g improve high-frequency characteristics of the high-voltage lateral field effect transistors 33/34 and power consumption.

The high-voltage lateral field effect transistors 33 and 34 turn on, and the output signal is changed to a low level.

On the other hand, when the potential level at the signal input node 37 is increased, the prior art high-voltage field effect transistor 31 turns on, and the potential level at the heavily doped n-type drain region 11g raises. However, the lightly doped n-type extended drain region 11cx reduces the potential level at the auxiliary drain electrode 11m, and the output signal does not damage the gate insulating layer of the next field effect transistor (not shown).

As will be appreciated from the foregoing description, the high-voltage lateral field effect transistor according to the present invention internally decreases the drain potential, and the step-down drain potential does not damage the gate insulating layer.

Although particular embodiments of the present invention have been shown and described, it will be obvious to those skilled in the art that various changes and modifications may be made without departing from the spirit and scope of the present invention.

For example, a p-channel type high-voltage lateral field effect transistor according to the present invention may be fabricated on an n-type semiconductor substrate or an n-type well by exchanging the conductivity types of the impurity regions.

The high-voltage lateral field effect transistor according to the present invention may be fabricated on a compound semiconductor substrate.

The high-voltage lateral field effect transistors 33 and 34 may form a current mirror stage of another electric circuit.

What is claimed is:

1. A lateral field effect transistor fabricated on a semiconductor layer of a first conductivity type, comprising:
   a channel region formed in a first surface portion of said semiconductor layer;
   a gate insulating layer formed on said channel region;
   a gate electrode formed on said gate insulating layer;
   a source region formed in a second surface portion of said semiconductor layer on one side of said first surface portion, and having a second conductivity type opposite to said first conductivity type;
   a lightly doped impurity region of said second conductivity type formed in a third surface portion of said semiconductor layer on the other side of said first surface portion;
   a heavily doped drain region of said second conductivity type formed in a first surface portion of said lightly doped impurity region;
   a biased region of said first conductivity type formed in a second surface portion of said lightly doped impurity region between said channel region and said heavily doped drain region;
   a step down region of said second conductivity type formed between portions of said biased region, and connected to said lightly doped impurity region;
   a source electrode connected to said heavily doped source region;
   a main drain electrode connected to said heavily doped drain region, and reversely biasing said lightly doped impurity region with respect to said biased region and said semiconductor layer so as to deplete said lightly doped impurity region between said biased region and said semiconductor layer; and
   an auxiliary drain electrode connected to said lightly doped impurity region for transmitting a step-down potential level therefrom.

2. The lateral field effect transistor as set forth in claim 1, in which said step-down region is implemented by a heavily doped step-down region larger in dopant concentration than said lightly doped impurity region, and said heavily doped step-down region is nested within a third surface portion of said lightly doped impurity region exposed to a surface of said biased region.

3. The lateral field effect transistor as set forth in claim 2, in which said biased region has finger portions spaced apart from each other by said surface of said third surface portion.

4. The lateral field effect transistor as set forth in claim 2, in which said heavily doped step-down region is spaced from said finger portions of said biased region.

5. The lateral field effect transistor as set forth in claim 1, in which said auxiliary drain electrode is further connected to said gate electrode.

6. The lateral field effect transistor as set forth in claim 1, in which said lightly doped impurity region is completely depleted.

7. An electric circuit fabricated on a semiconductor substrate of a first conductivity type, comprising:
   a first source of constant voltage;
   a second source of constant voltage different from said first source of constant voltage;
   a first lateral field effect transistor including
      a first channel region formed in a first surface portion of said semiconductor substrate,
      a first gate insulating layer formed on said first channel region,
      a first gate electrode formed on said first gate insulating layer,
      a first source region formed in a second surface portion of said semiconductor substrate on one side of said first surface portion and having a second conductivity type opposite to said first conductivity type,
      a first lightly doped impurity region of said second conductivity type formed in a third surface portion of said semiconductor layer on the other side of said first surface portion,
      a first heavily doped drain region of said second conductivity type formed in a first surface portion of said first lightly doped impurity region,
      a biased region of said first transistor said biased region of said first transistor being of said first conductivity type formed in a second surface portion of said first lightly doped impurity region between said first channel region and said first heavily doped drain region,
      a first step down region of said second conductivity type formed between portions of said biased region of said first transistor and connected to said first lightly doped impurity region,
      a first source electrode connected between said first heavily doped source region and said second source of constant voltage,
      a first main drain electrode connected between said first heavily doped drain region and said first source of constant voltage and reversely biasing said first lightly doped impurity region with respect to said biased region of said first transistor and said semiconductor substrate so as to deplete said lightly doped impurity region between said biased region of said first transistor and said semiconductor substrate, and
      an auxiliary drain electrode connected to said lightly doped impurity region for transmitting a step-down potential level therefrom; and
   a second lateral field effect transistor including
      a second channel region formed in a fourth surface portion of said semiconductor substrate,
      a second gate insulating layer formed on said second channel region,
      a second gate electrode formed on said second gate insulating layer and electrically connected to said first gate electrode,
      a second source region of said second conductivity type formed in a fifth surface portion of said semiconductor substrate on one side of said fourth surface portion,
      a second lightly doped impurity region of said second conductivity type formed in a sixth surface portion of said semiconductor substrate on the other side of said fourth surface portion, a second heavily doped drain region of said second conductivity type formed in a first surface portion of said second lightly doped impurity region, a biased region of said second transistor, said biased region of said second transistor being of said first conductivity type formed in a second surface portion of said second lightly doped impurity region between said second channel region and said second heavily doped drain region, a second step down region of said second conductivity type formed between portions of said biased region of said second transistor, and connected to said second lightly doped impurity region, a source electrode connected between said second source of contact voltage and said second heavily doped source region, a second main drain electrode connected between said first source of constant voltage and said second heavily doped drain region and reversely biasing said second lightly doped impurity region with respect to said biased region of said second transistor and said semiconductor substrate so as to deplete said second lightly doped impurity region between said biased region of said second transistor and said semiconductor substrate, and a conductive strip connected between said second gate electrode and said second lightly doped impurity region so as to propagate a second step-down potential to said first and second gate electrodes.

8. The electric circuit as set forth in claim 7, further comprising a third lateral field effect transistor connected between said first source of constant voltage and said first lateral field effect transistor and having a third gate electrode applied with an input voltage, and a fourth lateral field effect transistor connected between said first source of constant voltage and said second lateral field effect transistor and having a fourth gate electrode applied with a complementary signal of said input signal.

* * * * *